United States Patent [19]

Carlson et al.

[11] Patent Number: 4,897,604

[45] Date of Patent: Jan. 30, 1990

[54] METHOD AND APPARATUS FOR SELECTIVE ADJUSTMENT OF RF COIL SIZE FOR MAGNETIC RESONANCE IMAGING

[75] Inventors: Joseph W. Carlson, Kensington; Leon Kaufman, San Francisco; Peter A. Rothschild, Alameda, all of Calif.

[73] Assignee: The Regents of the University of California, Berkeley, Calif.

[21] Appl. No.: 312,189

[22] Filed: Feb. 21, 1989

[51] Int. Cl.⁴ .............................................. G01R 33/20
[52] U.S. Cl. .................................... 324/318; 324/322; 128/653 SC
[58] Field of Search ............... 324/307, 309, 318, 322; 128/653

[56] References Cited

U.S. PATENT DOCUMENTS 4,587,493  5/1986  Sepponen ............................ 324/318
4,733,190  3/1988  Dembinski ........................... 324/318

FOREIGN PATENT DOCUMENTS 2145230  3/1985  United Kingdom ................. 324/318

Primary Examiner—Michael J. Tokar
Assistant Examiner—Kevin D. O'Shea
Attorney, Agent, or Firm—Nixon & Vanderhye

[57] ABSTRACT

A bridge conductors for the turns of an MRI RF coil may be connected serially within a connector joint area of an inductive coil so as to selectively increase its physical size (e.g., so as to accommodate larger patient volumes to imaged therewithin). Serial capacitance may be included in at least one of the bridging conductors so as to substantially reduce the net inductive impedance of the added bridge conductors such that the standard coil RF tuning and impedance matching circuits may still operate within their normal predetermined adjustable ranges.

14 Claims, 4 Drawing Sheets

TO RF RCVR OF MRI SYSTEM

ZERO NET INDUCTANCE BRIDGE OF SELECTED LENGTH X

METHOD AND APPARATUS FOR SELECTIVE ADJUSTMENT OF RF COIL SIZE FOR MAGNETIC RESONANCE IMAGING

BACKGROUND OF THE INVENTION

1. Field of the Invention

This invention is generally related to the field of magnetic resonance imaging (MRI) using nuclear magnetic resonance (NMR) phenomena. It is particularly directed towards method and apparatus for realizing practical adjustably sized RF coils for use in MRI procedures.

2. Related Art

Magnetic resonance imaging is now in widespread commercial usage. Magnetic resonance spectroscopic imaging (MRSI) is also now emerging from the laboratory. For purposes of this invention, the term magnetic resonance imaging (MRI) will be used as generally encompassing both areas of endeavor.

In MRI systems, selected nuclei are excited to nuclear magnetic resonance (NMR) by suitable RF signals transmitted into an object image volume under the influence of suitable magnetic fields. Resultant NMR RF responses are detected as emanating from that same volume and subsequently are processed so as to produce spatial maps of NMR nuclei populations which appear as visual images representing cross-sections through the image volume. Necessary RF signal coupling to/from the image volume is made via tuned RF coils spatially disposed about or substantially adjacent to the image volume. Sometimes a common coil structure is used for both RF signal transmission and reception. In other instances, separate dedicated RF coil structures are utilized for the transmit and receive phases, respectively of the MRI process.

To achieve a high "filling factor" when coil structures are designed so as to completely circumscribe the patient image volume (e.g., abdomen, neck, etc.), it is desirable to have the coil structure conformed as closely as possible to the patient anatomy. Consequently, so as to permit easy insertion of the proper portion of the patient anatomy, there is typically a joint area where the turns of an RF coil are separably connected via various types of RF conductive connectors. Thus, the coil structure can be selectively opened at this joint area so as to permit admission of the patient anatomy and then closed about the anatomy making proper RF electrical connections for use in a subsequent MRI procedure (after which the joint is then again opened to permit easy egress of the patient anatomy).

The need for achieving high filling factors is especially useful, for example, with relatively low magnetic field MRI (having correspondingly lower NMR frequencies) and where so-called "surface" coils of the solenoidal type are used to wrap about the appropriate portion of the patient anatomy (e.g., abdomen, neck, etc.).

At such relatively low frequencies (e.g., about 2.77 MHz), several turns are typically used so as to increase the inductance of the coil. However, if too many turns are used, the connector joint area gets overly complicated. Thus, for lower MRI field uses, neck coils might take, for example, three turns while belt coils for imaging the abdomen may typically involve two turns.

Typically, such coils might have, for example, two microhenries of inductance for operation at 2.77 MHz with about 1600 picofarads of parallel RF tuning capacitance so as to achieve resonance at this frequency. In a typical application, RF resonace tuning is achieved with only about 100 picofarads of variable capacitance range since this is the typical range of the typical varicap used for remote RF tuning. If additional varicaps are connected in parallel so as to achieve added tuning range, then the capacitance per volt of tuning control voltage quickly becomes too great for proper fine tuning control.

With such a limited predetermined range of RF tuning capacitance, the overall inductance of the coil also must be within a similarly narrow range for proper resonance tuning (e.g., after the coil is loaded by insertion of the patient anatomy). In the example just discussed, where there is perhaps only about 100 picofarads of variable capacitance out of a total tuning capacitance of 1600 picofarads, there is only about 6% variability—implying that the total loaded coil inductance also can only have a range of about 6% for proper resonant tuning.

Since human anatomy (or animal anatomy or other imaged object volumes) does not come in uniform sizes, it is often desirable to have an appropriately sized MRI RF coil for use with a given size patient anatomy. Ideally, there would be some form of coil size adjustment that would permit an operator to easily vary the size of a coil so as to fit the patient anatomy at hand.

Although the inventors do not possess access descriptive documents, it is believed that one adjustably sized RF coil structure of a "belt-type" is commercially available from an MRI supplier named FONAR. Differently sized "belts" are apparently provided with a banana-type plug connector at each end of the belt. Any of the belts apparently can be conveniently wrapped about a patient anatomy (an abdomen) and plug connected to the pigtails of a termination box (presumably having RF tuning and/or impedance matching circuits there within). However, in this circumstance, instead of adjusting the size of a relatively fixed coil structure, one is in reality simply substituting one size coil structure for a differently sized coil structure (or perhaps leaving some excess belt at the end connection points) and plug connecting that to a common RF tuning and matching circuit.

The inventors also understand (but presently possess no documentation) that a head coi supplied by Bicker MRI Inc. for its MRI system includes a section which may be completely disconnected from other portions of the coil so as to permit easy entry of the head anatomy. It is then reconnected via a suitable RF plug connectors so as to effectively reassemble the coil about the patient's head. So far as presently known, it does not appear that such plug connected section is used to change the size of the basic coil structure in this arrangement.

BRIEF SUMMARY OF THE INVENTION

We have now discovered that a given RF coil structure can be effectively adjusted in size by including flexible portions on either side of a connector joint into which differently sized bridge conductor sections can be plug connected.

In situations such as that described above where there is only a very narrow range of available RF tuning (e.g., 6% in the above example), merely providing the ability to add or substract turn lengths (by adding, substituting or removing bridge sections) may not suffice. In particular, the net change in inductive impedance caused by these changes in turn lengths may actually be larger than the available RF tuning range.

However, operation within the same predetermined adjustable tuning range of the RF tuning and impedance matching circuits can still be maintained by including serial capacitance in at least one of the bridge conductors such that the net imaginary (e.g., inductive) impedance added by the bridge structure is sufficiently reduced (e.g., preferably minimized or made to be approximately zero). That is, the bridge element may include both inductive and capacitive impedance which collectively present a sufficiently low net added impedance (when the bridge element is additively connected into the joint area of the coil so as to increase its size) that the same RF tuning/impedance matching capacitance may be used to tune the loaded (and now expanded size) coil to resonance and matched impedance conditions.

Although the main coil structure preferably includes flexible portions so as to accommodate the bridge elements(s) and thus change its size, the bridge elements (s) themselves preferably may be relatively more rigid and of a properly curved cross-section so as to help determine the final shape of the expanded coil structure when connected therewithin.

BRIEF DESCRIPTION OF THE DRAWINGS

These as well as other objects and advantages of this invention will be more completely appreciated by reading the following detailed description of presently preferred exemplary embodiments of this invention taken in conjunction with the accompanying drawings, of which.

DETAILED DESCRIPTION OF THE EXEMPLARY EMBODIMENTS

Figure 1:
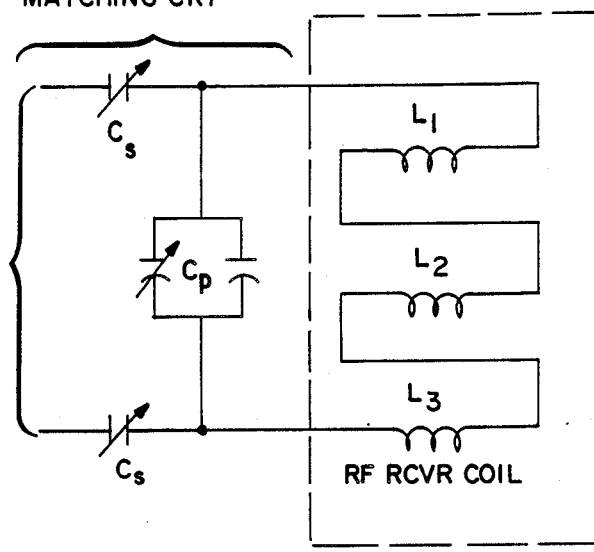
FIG. 1 is a schematic depiction of a typical prior art RF receiver coil with its associated RF tuning and impedance matching circuits.

As shown in FIG. 1, an RF receiver coil for use in an MRI system may include plural turns having respectively associated inductances L1, L2 and L3 collectively connected across a parallel tuning capacitance $C_p$ and through coupling capacitances $C_s$ (which may be balanced or unbalanced). The purposes of the capacitance $C_p$ and the capacitances $C_s$ are to achieve RF resonance at a predetermined frequency (i.e., the NMR frequency for nuclei to be imaged within a magnetic field of given strength) and also to match the RF impedance to a suitable transmission line (e.g., for connection to the standard RF receiver of the MRI system). One typical schematic arrangement of such circuits is depicted in FIG. 1.

As earlier noted, the variable tuning capacitance $C_p$ may actually be realized as an electrically tuned varicap providing a fairly narrow predetermined tuning range for the RF receiver coil.

Figure 2:
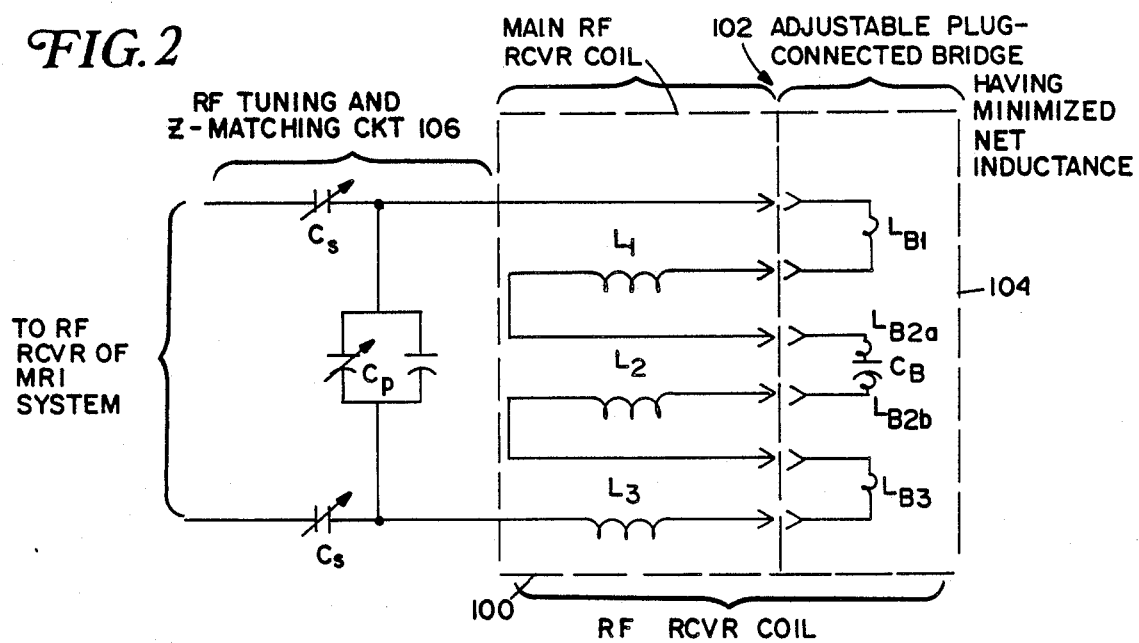
FIG. 2 is a schematic depiction of an RF receiver coil having an adjustable plug-connected bridge unit in accordance with this invention.
Figure 3:
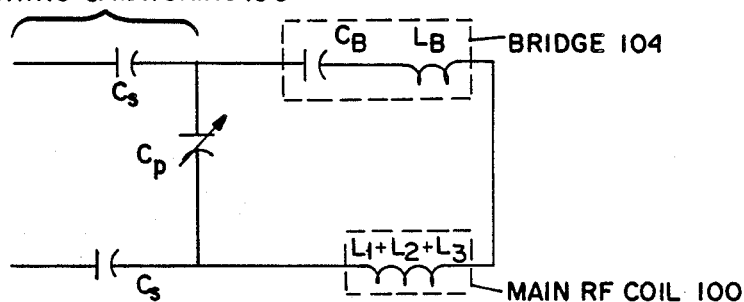
FIG. 3 is a simplified schematic diagram of the circuit shown in FIG. 2.

As depicted in FIG. 2, the main RF receiver coil 100 may include a plug-connectable joint area 102. When a plug-connected bridge element 104 is inserted into this joint area, it provides an adjustable size for the main RF receiver coil by including properly sized bridge conductors for each turn having associated inductance LB1, LB2, and LB3. In the preferred exemplary embodiment, a properly sized capacitance $C_B$ is included serially in at least one of the bridge conductors so as to minimize the net inductive impedance added by the bridge element 104 when plug-connected within the joint area 102 of the main RF receiver coil. In this manner, the standard RF tuning and impedance matching circuit 106 may still be used to achieve proper RF resonance tuning. A simplified electrical schematic diagram of the resultant circuit is depicted in FIG. 3.

Preferably, the bridge capacitor is sized so as to minimize if not totally eliminate the net inductance added by the bridge conductors inserted within the various turns of the coil. For example, an optimum value for the bridge capacitor can be computed in accordance with the following formula:

$$C_B１/[w^2(L'-L)]$$

where L is the original or main coil inductance (L1+L2+L3) and L' is the coil inductance (LB1+LB2+LB3) added by the bridge conductors (without any capacitive component) and w is the predetermined RF resonant frequency to which the coil is to be tuned.

For example, for operations at 2.77 MHz, the original or main coil inductance may typically be approximately 2 microhenries. With added bridge elements this might be increased to approximately 2.5 microhenries (without any capacitive components). With these parameter values, the capacitance $C_B$ should be approximately 6,600 picofarads so as to approximately cancel the added net inductance associated with the bridge conductors per se. In this manner, the total composite net inductance of the coil structure is left at approximately 2 microhenries even after the adjustable bridge element has been inserted (by suitable plug connectors within the joint area 102).

As should be appreciated, although the exemplary embodiments utilize solenoidal RF receiver coils, the invention can be used with virtually any type of MRI RF coil (especially of the surface type) where adjustably sized segments can be utilized so as to permit better fits to variably sized anatomies. Such features are, of course, of more importance for lower frequency operations (e.g., 2.77 MHz) where the limited tuning range of a typical varicap capacitance is an important factor. However, even at higher frequencies (e.g., 15 MHz) coils of higher inductance may be able to realize advantage from use of this invention.

Figure 4:
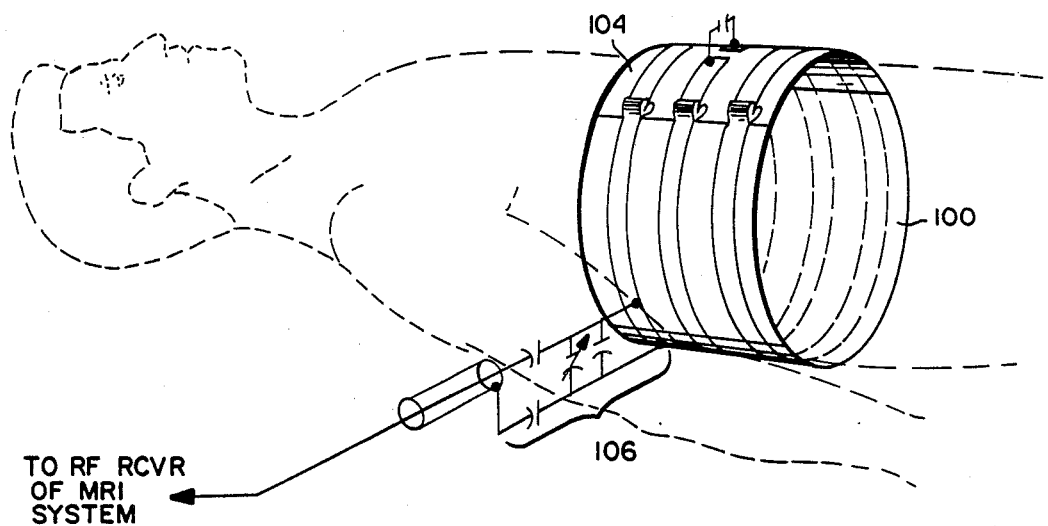
FIG. 4 is a diagrammatic depiction of a solenoidal coil disposed about the abdomen anatomy of a patient with a bridge element in place so as to increase the circumferential size of a coil structure.
Figure 5:
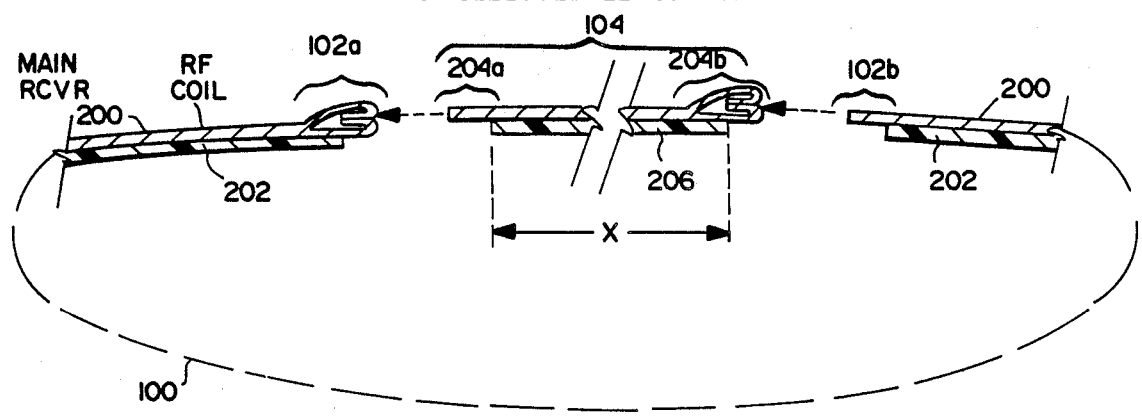
FIG. 5 is a diagrammatic cut away cross-sectional depiction of the coil shown in FIG. 4.

An expanded size coil 100 already having bridge element 104 plug-connected in place is diagrammatically depicted at FIG. 4 in place about a patient's neck anatomy. As depicted in FIG. 5, the zero net inductance bridge may have a selected length X to similarly expand the coil size when plug-connected between the female and male connector portions 102A and 102B of joint area 102 (which connectors 102A and 102B may be matingly connected together for a "normal" smaller size patient). Typically, the main RF receiver coil 100 includes conductive portions 200 formed on a flexible insulating substrate 202 (which may be photo-resist etched from a copper cladded insulating substrate in the manner of conventional printed circuit boards).

The male and female mating plug connectors 102B, 102A on the main coil structure 100 and connectors 204B, 204A on the bridge element may be of suitable conventional design. Typically, the female connector may include a beryllium copper spring portions (e.g., of the type used on door connectors of RF screen rooms) while the male portion of the connector may be a simple extended portion of the printed circuit conductor of the turn (or an extender conductor element soldered or otherwise conductively affixed thereto).

The bridge element 104 may typically also be formed on an insulating substrate 206. However, in the preferred exemplary embodiment, this substrate is of a more rigid material and is formed so as to include an appropriate curvature to help establish the proper shape of the flexible main coil 100 when the bridge element is connected within the joint area 102.

Figure 6:
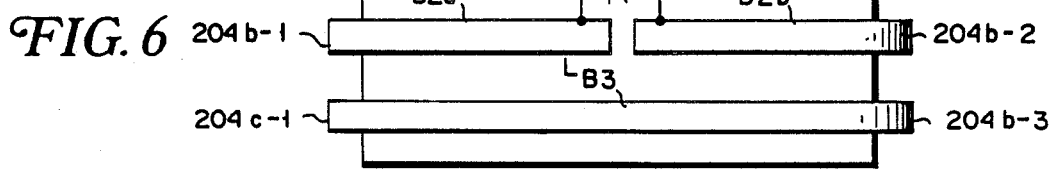
FIG. 6 is a plan view, partially diagramatic, of the bridge element shown in FIG. 4.

A plan view of the bridge unit 104 is shown in FIG. 6. As will be appreciated, the bridge capacitance $C_B$ is shown schematically in FIG. 6, but in reality may take the form of a small rectangular or circular element with tabs soldered across a conductivity break in the middle bridge conductor. As shown, in the preferred embodiment, the capacitance is located so as to present a symmetrical, balanced, RF circuit.

Figure 7:
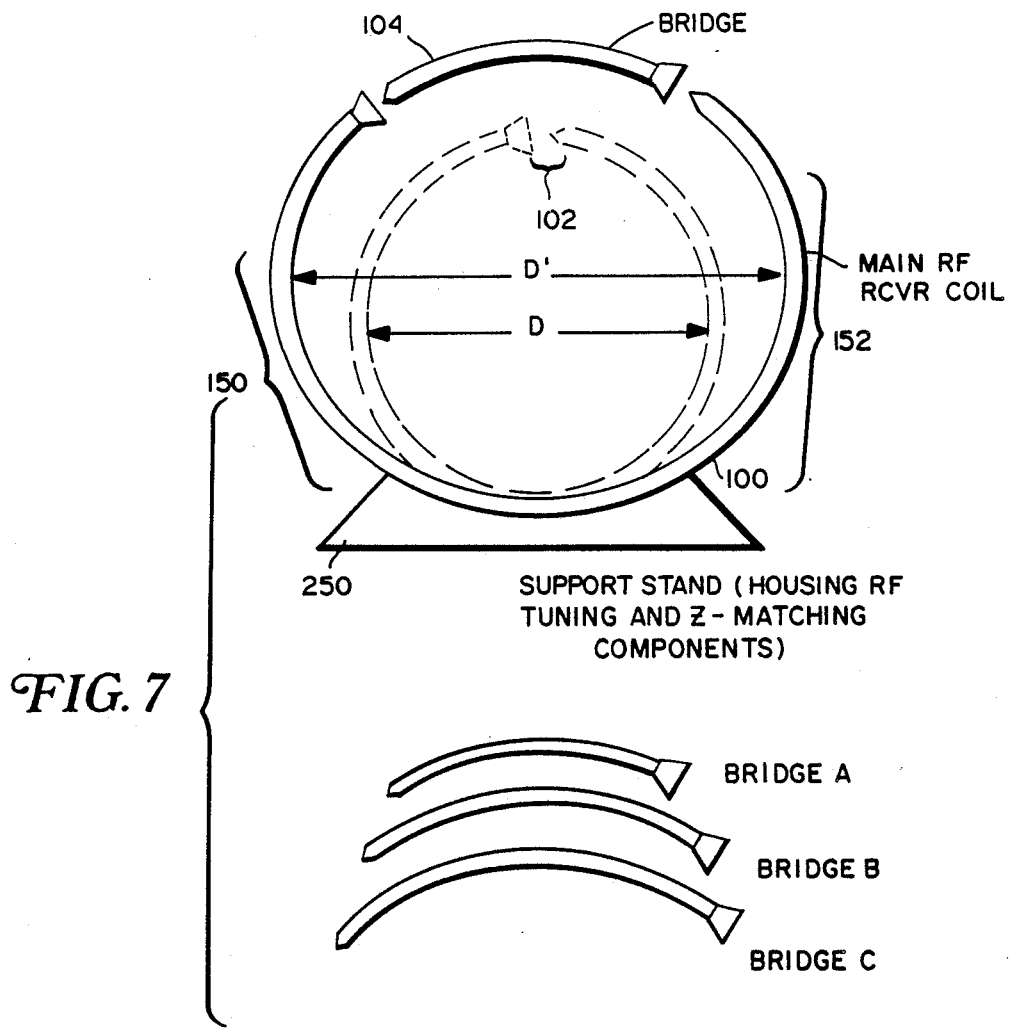
FIG. 7 depicts an MRI RF coil assembly in accordance with this invention including a support stand for housing RF tuning and impedance matching components as well as a collection of differently sized bridge elements for changing the size of the basic coil structure.

As depicted by dotted lines in FIG. 7, when the bridge 104 is not present and the joint area 102 is plug-connected together by itself, a "normal" diameter D is realized for the receiver coil. On the other hand, when a bridge 104 is inserted into place, flexible portions 150, 152 of the main receiver coil structure 100 flex sufficiently to reform a new composite coil conductor with correspondingly larger diameter D'.

A support stand 250 may be suitably shaped (e.g., to aid in proper neck or back support) and fixedly attached to the mid-portion of coil 100 so as to maintain it in a predetermined orientation. This housing also may contain any necessaryy RF tuning impedance matching components. As previously mentioned, a collection or "set" of bridges A, B, C having different respective lengths (and correspondingly different suitably sized capacitance) and relatively more rigid cross-sections of appropriate curvature may be associated with the coil apparatus so that an appropriate one of the bridges might be used to realize an appropriate final diameter for the composite coil structure in actual use.

Figure 8:
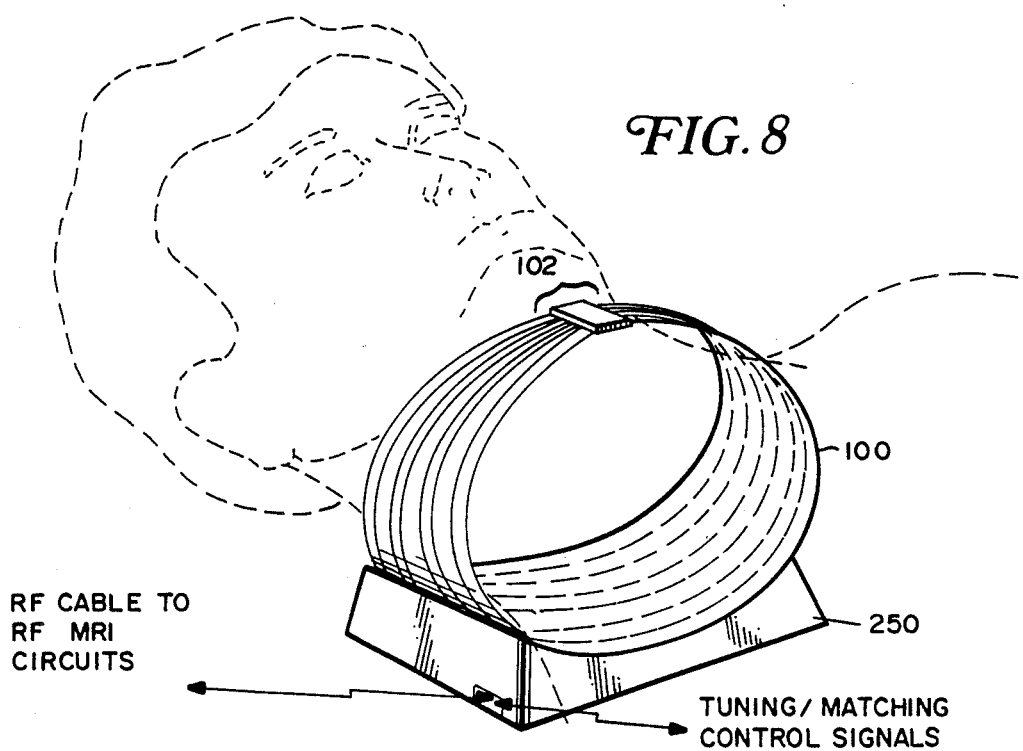
FIG. 8 is a perspective view of an exemplary solenoidal neck coil constructed in accordance with this invention.

An exemplary neck coil embodiment of this invention is depicted more particularly at FIGS. 8-12. Here, in FIG. 8, the joint portion 102 as shown as connected without a bridge connector so is to realize the minimum diameter coil 100. As shown in FIG. 8, suitable connections to RF MRI circuits and to tuning/matching control voltage conductors may be made via suitable cable connections with the base 250 (in which the tuning and matching circuits may be located).

Figure 9:
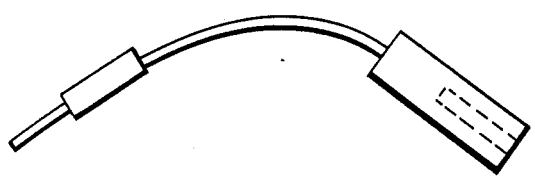
FIGS. 9 and 10 are side and top views respectively of a more rigid bridge element for insertion into the joint area of the coil shown in FIG. 8.
Figure 10:
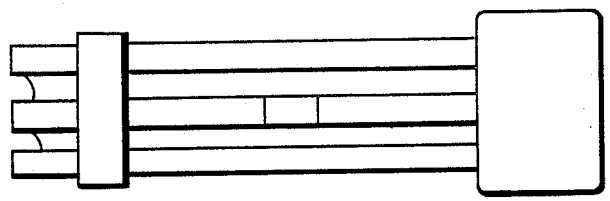

As depicted in FIG. 9, the adaptor may be made of suitable dimensions (e.g., 3.5 inches long plus additional connector housing length) and made of relatively rigid structure having a slight bend to match the radius of curvature of the resulting composite coil. In this exemplary embodiment, three solenoidal turns are employed of ½ inch wide copper with approximately ¼ inch spaces between the copper conductors of the turns at the lower portion disposed nearest the neck's spinal column members. To help accommodate the chin, a suitable narrowing and shaping of the coil is effected as shown. As seen in the top view of FIG. 10, the center of these three bridge conductors contains a serially connected capacitance element (e.g., 6,000 picofarads) to minimize the added collective inductive reactance of the several bridge conductors.

Figure 11:
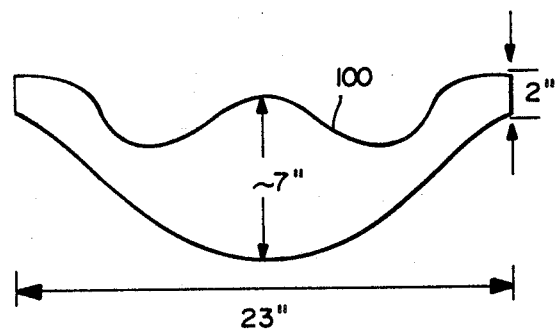
FIG. 11 is a "flattened out" view of the flexible printed circuit board used for the neck coil of FIG. 8.
Figure 12:
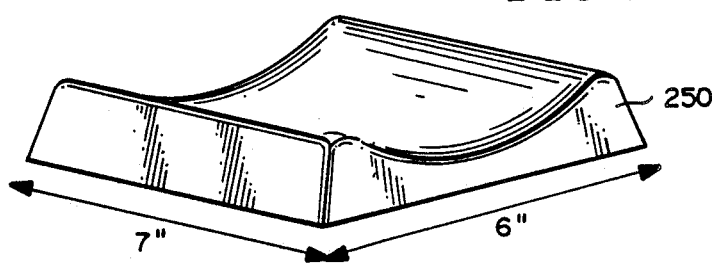
FIG. 12 is a perspective view of the base unit used with the exemplary embodiment of FIG. 8.

When flattened out, the flexible circuit board used for the main neck coil has the configuration and size shown in FIG. 11 for the presently preferred exemplary embodiment of neck coil. Base 250 is similarly depicted in more detail at FIG. 12. The printed circuit board is fixedly mounted onto the base with suitable electrical connections being made from the coil at the lower portion of the turns directly into the base housing area. There, the coil is suitably and conventionally connected to RF tuning/matching components. In the exemplary embodiment, the coil 100 has three turns so there will be three male "pins" on one side and three female plugs on the other side of the connector structure used in the joint area 102.

While only a few exemplary embodiments have been depicted in detail, those skilled in the art will recognize that many variations and modifications may be made in these exemplary embodiments while yet retaining many of the novel features and advantages of the invention. Accordingly, all such variations and modifications are intended to be included within the scope of the appended claims.

What is claimed is:
1. An MRI RF receiver coil comprising:
a solenoidal inductive coil having plural conductor turns;
mated conductive connectors separably connecting each of said turns across a predetermined joint area;
an RF tuning capacitance connected with said coil and having a predetermined adjustable tuning range for tuning the coil to a predetermined resonant RF frequency when loaded by the presence of an object to be imaged within said coil; and
a bridge element having plural bridge conductors thereacross with conductive connectors for mating separable serial connection with the conductive connectors of each of said turns within said joint area thereby expanding the size of said coil;
said bridge element having a sufficiently low net impedance when added to said coil that said RF turning capacitance remains capable of tuning the loaded expanded coil to resonance.

2. An MRI RF receiver coil as in claim 1 wherein: at least one of said bridge conductors includes a serial capacitance element.

3. An MRI RF receiver coil as in claim 2 wherein said serial capacitance element is sized so as to approximately cancel the net inductive impedance of said bridge conductors.

4. An MRI RF receiver coil as in claim 1, 2 or 3 comprising a collection of said bridge elements of respectively different lengths for selective use in expanding the coil size by correspondingly different amounts.

5. An MRI RF receiver coil as in claim 1 wherein said coil includes flexible portions on either side of said joint area and a base unit disposed opposite said joint area, said base unit housing said RF tuning capacitance.

6. An MRI RF receiver coil as in claim 5 wherein said bridge element has a rigid curved cross-section corresponding to the expanded curved cross-section of the coil when the bridge unit is connected therewithin.

7. RF coil apparatus for use in a magnetic resonance imaging (MRI) system, said apparatus comprising:
   an inductive coil having at least one turn of conductor with a plug connectable joint therein;
   a capacitive RF tuning and impedance matching circuit connected between said inductive coil and an RF transmission line port; and
   a conductor bridge selectively plug connectable serially within said joint of the inductive coil so as to selectively increase its circumference, said conductor bridge also including a serial capacitance element which reduces the net inductance added to the inductive coil when said conductor bridge is selectively connected thereinto.

8. RF coil apparatus as in claim 7 wherein said inductive coil has a generally cylindrical shape when self-connected at said joint and which is sufficiently flexible to accommodate said bridge when connected into said joint by flexing to a larger diameter.

9. RF coil apparatus as in claim 8 wherein said bridge is of curved cross-section and of more rigid shape than said inductive coil so as to help define the composite cylindrical shape of the inductive coil when connected into said joint.

10. RF coil apparatus as in claim 7 wherein said capacitance element approximately eliminates the net inductive impedance added to the coil when the bridge is in place at a predetermined RF frequency for MRI to which said coil is resonantly tuned by said RF tuning and impedance matching circuit.

11. RF coil apparatus for use in a magnetic resonance imaging (MRI) system, said apparatus comprising:
    a main RF coil portion having first conductors with separable first ends which may be matingly engaged to form a completed MRI RF coil of a first circumferential size;
    a separate bridging RF coil portion having second conductors with second ends arranged for mating conductive engagement between said first ends so as to form a completed MRI RF coil of a second circumferential size larger than first size and including a series capacitance element in at least one of said second conductors to reduce the collective net added imaginary impedance of the second conductors when connected as part of said completed MRI RF coil; and
    an RF tuning impedance matching circuit connected to said main RF coil portion for tuning said completed MRI RF coil to a selected resonant frequency and matching its RF impedance to a selected value either with or without use of said separate bridging Rf coil portion.

12. RF coil apparatus as in claim 11 comprising a plurality of said separate bridging RF coil portions, each having different dimensions so as to produce correpondingly different second circumferential sized computed MRI RF coils depending upon which bridging RF coil section is used.

13. RF coil apparatus as in claim 11 wherein the inductive impedance magnitude wL of said second conductors at said selected resonant frequency is approximately equal to the series capacitive impedance magnitude 1/wc at said selected resonant frequency so as to reduce said collective net added imaginary impedance to approximately zero.

14. A method for expanding the size of an MRI RF coil without necessitating the use of differently scaled RF resonance tuning and/or impedance matching circuits, said method comprising the steps of:
    providing conductive turn bridges with serial capacitance substantially reducing the net inductive impedance of said bridge at a predetermined MRI Rf resonant frequency; and
    selectively inserting said bridges serially within the turns of an MRI RF coil when it is desired to increase the size of said coil.

* * * * *